United States Patent
Moriyama et al.

(10) Patent No.: US 8,513,038 B2
(45) Date of Patent: Aug. 20, 2013

(54) METHOD OF MANUFACTURING ORGANIC ELECTROLUMINESCENT DEVICE

(71) Applicant: Canon Kabushiki Kaisha, Tokyo (JP)

(72) Inventors: Takashi Moriyama, Yokohama (JP); Nozomu Izumi, Chiba (JP); Taro Endo, Kawasaki (JP); Tomoyuki Hiroki, Mobara (JP); Satoru Shiobara, Mobara (JP); Nobuhiko Sato, Mobara (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 13/681,879

(22) Filed: Nov. 20, 2012

(65) Prior Publication Data
US 2013/0137205 A1    May 30, 2013

(30) Foreign Application Priority Data
Nov. 25, 2011  (JP) .................................. 2011-257781

(51) Int. Cl.
*H01L 21/00* (2006.01)
*H01L 51/40* (2006.01)

(52) U.S. Cl.
USPC .. 438/34; 438/99; 257/E21.219; 257/E21.255

(58) Field of Classification Search
USPC ...................... 438/34; 257/E21.219, E21.255
See application file for complete search history.

(56) References Cited

U.S. PATENT DOCUMENTS

| | | | |
|---|---|---|---|
| 7,332,369 B2* | 2/2008 | Veres et al. ...................... | 438/99 |
| 7,932,123 B2* | 4/2011 | Rogers et al. .................... | 438/73 |
| 7,943,440 B2* | 5/2011 | Kim et al. ....................... | 438/149 |
| 2005/0186699 A1* | 8/2005 | Kawase et al. .................. | 438/99 |

FOREIGN PATENT DOCUMENTS

JP    4507759 A    3/2006

* cited by examiner

*Primary Examiner* — Lex Malsawma
(74) *Attorney, Agent, or Firm* — Canon U.S.A., Inc., IP Division

(57) ABSTRACT

A method of manufacturing an organic electroluminescent device includes a step of forming a masking layer and an intermediate layer on a first organic compound layer such that the masking layer and the intermediate layer have a predetermined pattern, a step of patterning the first organic compound layer using the masking layer and the intermediate layer, a step of forming a second organic compound layer, and a step of removing the intermediate layer and the second organic compound layer formed thereon in such a manner that the intermediate layer is contacted with a dissolving liquid for dissolving the intermediate layer. In the method, the first and second organic compound layers are protected by covering the first and second organic compound layers with a sacrificial layer until the patterning of the first and second organic compound layers is completed.

17 Claims, 3 Drawing Sheets

METHOD OF MANUFACTURING ORGANIC ELECTROLUMINESCENT DEVICE

BACKGROUND OF THE INVENTION

1. Field of the Invention

The present invention relates to a method of manufacturing an organic electroluminescent device including organic electroluminescent elements.

2. Description of the Related Art

An organic electroluminescent device is one in which a plurality of organic electroluminescent elements are arranged on a substrate in a matrix pattern. A full-color image can be displayed using pixels each including a set of organic electroluminescent elements emitting, for example, red light, green light, and blue light.

Each organic electroluminescent element has a structure in which an organic compound layer with a thickness of about tens to hundreds of millimeters is placed between a pair of electrodes. The organic compound layer includes at least one light-emitting sub-layer. The color of light emitted from the organic electroluminescent element can be changed by appropriately selecting a luminescent material.

A vacuum vapor deposition method is widely used to form organic compound layers. In the case of forming layers each containing a luminescent material corresponding to an organic electroluminescent element by the vacuum vapor deposition method in the course of manufacturing a multi-color organic electroluminescent device, a layer containing a predetermined luminescent material is selectively formed on a predetermined region using a metal mask having openings corresponding to deposition regions. However, a vacuum vapor deposition method using a metal mask is unsuitable for the manufacture of a high-definition display because the accuracy of the alignment of the metal mask with a substrate for deposition is low due to the thermal expansion of the metal mask.

Japanese Patent No. 4507759 discloses a method in which an organic compound layer is selectively formed by photolithography with high accuracy without using a high-definition metal mask. In particular, the organic compound layer is formed over a substrate, an intermediate layer made of a water-soluble polymer and a photoresist layer are provided on the organic compound layer in that order, the photoresist layer and the intermediate layer are patterned by a known technique, and the organic compound layer is then patterned using the photoresist layer and the intermediate layer as a mask. After the organic compound layer is patterned, the intermediate layer is removed by dissolving the intermediate layer in water and the photoresist layer is also removed (lifted off) from the organic compound layer.

As described in Japanese Patent No. 4507759, the intermediate layer is placed between the organic compound layer and the photoresist layer for the purpose of reducing the damage caused to the organic compound layer by the application, exposure, and development of a photoresist. Since the intermediate layer is made of such a water-soluble material, the photoresist layer can be removed by dissolving the intermediate layer in water and therefore the organic compound layer is not damaged.

However, after the photoresist layer is removed by dissolving the intermediate layer, pieces of the lifted-off photoresist layer damage a surface of the organic compound layer remaining on the substrate because the photoresist layer is insoluble in water. This causes luminescent defects in some cases. Furthermore, it is difficult to completely remove the water-soluble polymer from the organic compound layer by dissolving the water-soluble polymer and therefore the water-soluble polymer, which is insulating, remains on a surface or interface of the organic compound layer. This may possibly cause the increase in driving voltage of an organic electroluminescent element.

SUMMARY OF THE INVENTION

Aspects of the present invention have been made to solve the above problems and provide a method of manufacturing an organic light-emitting device, the method being capable of preventing a surface of an organic compound layer from being damaged or capable of preventing an intermediate layer made of an insulating material from remaining on the organic compound layer. In particular, a method of manufacturing an organic electroluminescent device including a substrate and organic electroluminescent elements which are placed on the substrate and which each include a first electrode, a portion of a second electrode, and an organic compound layer placed between the first electrode and the second electrode includes a step of forming a first organic compound layer, a first sacrificial layer, and an intermediate layer on the substrate provided with the first electrodes in that order; a step of selectively forming a masking layer on a predetermined region of the intermediate layer; a step of partly removing the intermediate layer, the first sacrificial layer, and the first organic compound layer from a region not covered by the masking layer; a step of forming a second organic compound layer and a second sacrificial layer over the remaining intermediate layer and the region from which the first organic compound layer is removed in that order; a step of removing the intermediate layer and the layers formed thereon in such a manner that the intermediate layer is contacted with a dissolving liquid and is dissolved therein; a step of removing the first and second sacrificial layers in such a manner that the first and second sacrificial layers are contacted with a dissolving liquid and are dissolved therein; and a step of forming the second electrode over the first and second organic compound layers remaining on the first electrodes. Alternatively, a method of manufacturing an organic electroluminescent device including a substrate and organic electroluminescent elements which are placed on the substrate and which each include a first electrode, a portion of a second electrode, and an organic compound layer placed between the first electrode and the second electrode includes, in this order, a step of forming a first organic compound layer, a first sacrificial layer, and a first intermediate layer on the substrate provided with the first electrodes in that order; a step of selectively forming a masking layer on a predetermined region of the first intermediate layer; a step of partly removing the first intermediate layer, the first sacrificial layer, and the first organic compound layer from a region not covered by the masking layer; a step of forming a second organic compound layer and a second sacrificial layer over the remaining first intermediate layer and the region from which the first organic compound layer is removed in that order; a step of removing the first intermediate layer and the layers formed thereon in such a manner that the first intermediate layer is contacted with a first dissolving liquid and is dissolved therein; a step of forming a second intermediate layer over the first sacrificial layer and the second sacrificial layer; a step of selectively forming another masking layer on a portion of the second intermediate layer that is located on one of a region having the first sacrificial layer and a region having the second sacrificial layer; a step of partly removing the second intermediate layer, the second sacrificial layer, and the second organic compound layer from a region not covered by this masking layer; a step of forming a third organic compound layer and a third sacrificial layer over the remaining second intermediate layer and the region from which the second organic compound layer is removed in that order; a step of removing the second intermediate layer and the layers formed thereon in such a manner that the second intermediate layer is contacted with a second dissolving liquid and is dissolved therein; a step of removing the first to third sacrificial layers in such a manner that the first to third sacrificial layers are contacted with a dissolving liquid and are dissolved therein; and a step of forming the second electrode over the first to third organic compound layers.

According to aspects of the present invention, an organic compound layer can be patterned without damaging a surface of the organic compound layer or without leaving an intermediate layer on a surface of the organic compound layer and an organic electroluminescent device having high definition and high properties can be manufactured.

Further features of the present invention will become apparent from the following description of exemplary embodiments with reference to the attached drawings.

DESCRIPTION OF THE EMBODIMENTS

Figure 1A:
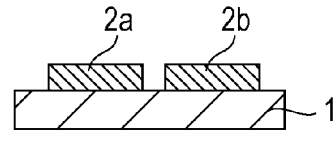
FIGS. 1A to 1J are schematic sectional views illustrating steps of a method of manufacturing an organic electroluminescent device according to a first embodiment of the present invention.

Aspects of the present invention provide a method of manufacturing an organic electroluminescent device including an organic electroluminescent element including a first electrode, a second electrode, and a patterned organic compound layer placed between the first and second electrodes.

An example of a method of manufacturing an organic electroluminescent device according to aspects of the present invention includes the following steps:
(A) a step of forming a first organic compound layer on a substrate provided with first electrodes;
(B) a step of forming a first sacrificial layer on the first organic compound layer;
(C) a step of forming an intermediate layer on the first sacrificial layer;
(D) a step of forming a masking layer on a predetermined region of the intermediate layer;
(E) a step of partly removing the intermediate layer, the first sacrificial layer, and the first organic compound layer from a region not covered by the masking layer;
(F) a step of forming a second organic compound layer and a second sacrificial layer on the region from which the first organic compound layer is removed;
(G) a step of removing the intermediate layer and the layers formed thereon in such a manner that the intermediate layer is contacted with a dissolving liquid and is dissolved therein;
(H) a step of removing the first and second sacrificial layers in such a manner that the first and second sacrificial layers are contacted with a dissolving liquid and are dissolved therein; and
(I) a step of forming a second electrode over the first and second organic compound layers.

The etching rate of the intermediate layer with respect to the dissolving liquid (a liquid for dissolving the intermediate layer) for dissolving the intermediate layer is greater than the etching rate of the first and second sacrificial layers with respect to the dissolving liquid for dissolving the intermediate layer. In addition, the etching rate of the first and second sacrificial layers with respect to the dissolving liquid for dissolving the first and second sacrificial layers is greater than the etching rate of the first and second organic compound layers with respect to the dissolving liquid for dissolving the first and second sacrificial layers.

This method may further include a step of forming a protective layer on the intermediate layer between Steps (C) and (D) and a step of removing the protective layer from the region not covered by the masking layer between Steps (D) and (E).

In this method, the first organic compound layer and the second organic compound layer are covered with the first sacrificial layer and the second sacrificial layer, respectively, until the patterning of the first and second organic compound layers is completed. Just before the second electrode is formed, the first and second sacrificial layers are dissolved, whereby a surface of the first organic compound layer and a surface of the second organic compound layer are exposed. That is, the surfaces of the first and second organic compound layers are protected with the first and second sacrificial layers just before the formation of the second electrode and therefore are not damaged by pieces of the removed masking layer, the second organic compound layer, or the like.

Embodiments of the present invention will now be described in detail with reference to the attached drawings. Widely known or well-known techniques can be applied to portions not shown or described herein. The embodiments are for exemplification only and are not intended to limit the present invention.

Figure 1F:
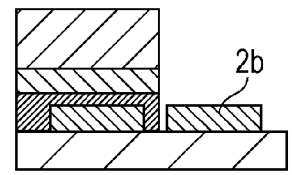
Figure 1B:
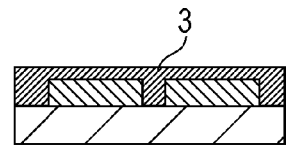
Figure 1G:
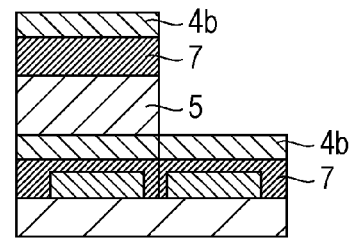
Figure 1C:
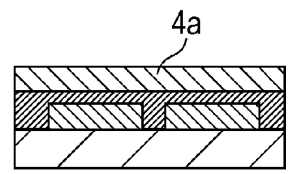
Figure 1H:
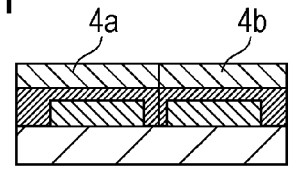
Figure 1D:
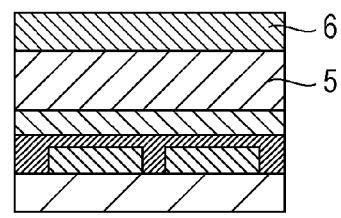
Figure 1I:
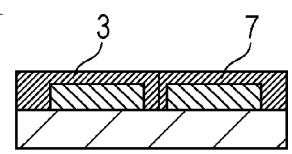
Figure 1E:
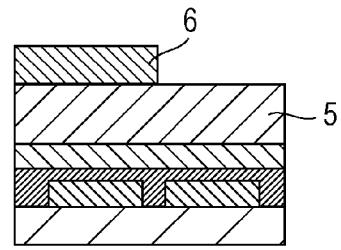

A first embodiment of the present invention provides a method of manufacturing a multicolor organic electroluminescent device including first organic electroluminescent elements which each include a first organic compound layer 3 and which emit light of a first color and second organic electroluminescent elements which each include a second organic compound layer 7 and which emit light of a second color. FIGS. 1A to 1J show steps of the method. FIG. 2 shows an example of the organic electroluminescent device, which is manufactured by the method as shown in FIGS. 1A to 1J. The organic electroluminescent device includes an element substrate 1 provided with a display region 10 and external connection terminals 11. The first organic electroluminescent elements, which each include the first organic compound layers 3, and the second organic electroluminescent elements, which include the second organic compound layers 7, are two-dimensionally arranged in the display region 10. The external connection terminals 11 are electrically connected to circuits, which are not shown, through wiring lines.

Figure 1J:
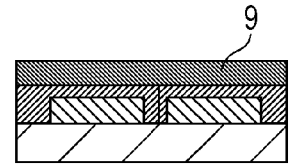
Figure 2:
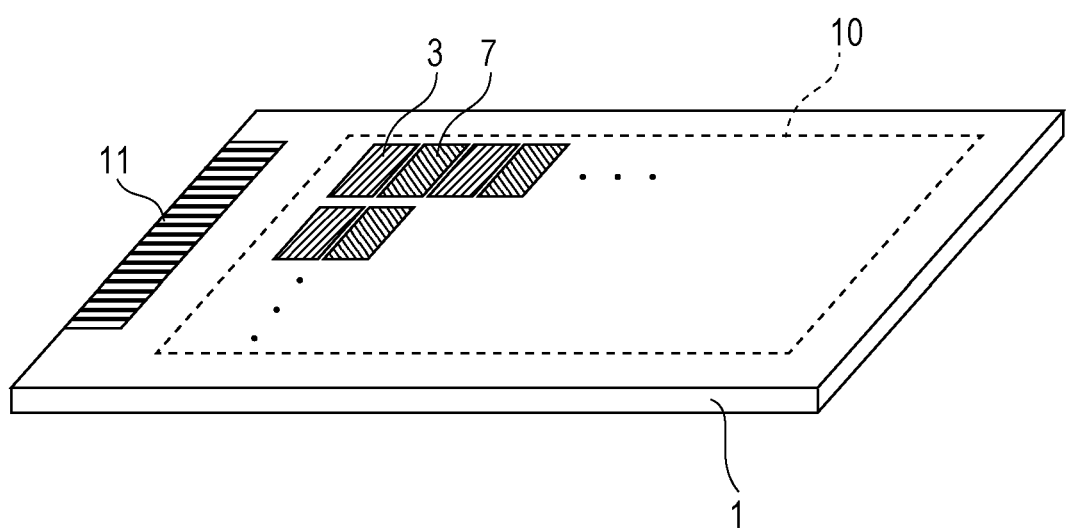
FIG. 2 is a schematic perspective view of the organic electroluminescent device according to the first embodiment.

One pixel including a pair of one of the first organic electroluminescent elements and one of the second organic electroluminescent elements is shown in FIG. 1J for simple illustration. However, in actual, a plurality of pixels are two-dimensionally arranged as shown in FIG. 2.

First electrodes 2a and 2b are formed on the element substrate 1 as shown in FIG. 1A. The element substrate 1 is not particularly limited and may be one useful in stably manufacturing and driving the organic electroluminescent device. The element substrate 1 may be, for example, an insulating or semiconducting support substrate, such as a glass or Si wafer, provided with a driving circuit for driving the organic electroluminescent device, a planarization layer for planarizing irregularities due to the driving circuit, and the like.

A conductive layer is formed over the element substrate 1 by a known process such as a vacuum vapor deposition process, a sputtering process, or a chemical vapor deposition (CVD) process and is then patterned by photolithography for each element, whereby the first electrodes 2a for the first organic electroluminescent elements and the first electrodes 2b for the second organic electroluminescent elements are formed. For example, a metal material such as Al or Ag, a transparent electrode material such as indium tin oxide (ITO) or indium zinc oxide, a multilayer film of these materials can be used to form the first electrodes 2a and 2b. Separating layers for partitioning light-emitting regions may optionally be provided between the neighboring first electrodes 2a and 2b.

The first organic compound layer 3 is formed on the element substrate 1 provided with the first electrodes 2a and 2b as shown in FIG. 1B. One or more selected from known low- and high-molecular-weight materials can be used to form the first organic compound layer 3. The first organic compound layer 3 is a monolayer or multilayer film and includes at least one light-emitting sub-layer. The first organic compound layer 3 may further optionally include a hole transport sub-layer, a hole injection sub-layer, an electron transport sub-layer, an electron injection sub-layer, and the like in addition to the light-emitting sub-layer.

A first sacrificial layer 4a is formed on the first organic compound layer 3 as shown in FIG. 1C. In this operation, a material for forming the first sacrificial layer 4a is selected such that the etching rate of the first sacrificial layer 4a with respect to a dissolving liquid for dissolving the first sacrificial layer 4a is greater than the etching rate of the first organic compound layer 3 with respect to the dissolving liquid for dissolving the first sacrificial layer 4a. The etching rate of the first sacrificial layer 4a with respect to the dissolving liquid for dissolving the first sacrificial layer 4a may be ten times or more the etching rate of the first organic compound layer 3 with respect to the dissolving liquid for dissolving the first sacrificial layer 4a and even 100 times or more. When the etching rate of the first sacrificial layer 4a with respect to the dissolving liquid for dissolving the first sacrificial layer 4a is less than ten times the etching rate of the first organic compound layer 3 with respect to the dissolving liquid for dissolving the first sacrificial layer 4a, in-plane uniformity is reduced during the dissolution of the first sacrificial layer 4a or the etching of the first organic compound layer 3 proceeds to impair element properties in some cases.

The first organic compound layer 3 may be made of, for example, a material free of a compound containing a polar site in its framework or substituent. The first sacrificial layer 4a may be made of a material containing a polar site. The term "compound containing a polar site" as used herein refers to a compound containing a hetero-atom such as N or O. In the case of selecting such materials, the first sacrificial layer 4a can be selectively removed using a polar solvent to dissolve the first sacrificial layer 4a. Examples of the polar solvent include water and solvents containing organic compounds (organic compounds containing a polar site) containing a hetero-atom such as N, O, or S. The outermost sub-layer (a sub-layer that is farthest from the corresponding first electrode 2a) of the first organic compound layer 3 may be made of a material having an etching rate different from the etching rate of the first sacrificial layer 4a with respect to the polar solvent. In particular, the outermost sub-layer thereof may be made of an organic compound obtained by singly bonding condensed polycyclic hydrocarbons such as naphthalene, fluorene, fluoranthene, chrysene, anthracene, tetracene, phenanthrene, pyrene, and triphenylene. Examples of the organic compound include compounds containing a condensed polycyclic hydrocarbon group bonded to an alkyl group such as a methyl group or an ethyl group. Molecules contained in the polar solvent necessarily contain a hetero-atom. The hetero-atom functions as a polar site of each molecule contained in the polar solvent. This polar site interacts with a polar site contained in the first sacrificial layer 4a and therefore the first sacrificial layer 4a is dissolved in the polar solvent. The interaction between the polar site contained in the polar solvent and the polar site contained in the first sacrificial layer 4a affects the solubility of the first sacrificial layer 4a in the polar solvent. The polar solvent is selected in consideration of the structure of an organic material used to form the first sacrificial layer 4a. This allows the solubility of the first sacrificial layer 4a in the polar solvent to be higher than the solubility of the first organic compound layer 3 in the polar solvent. That is, the etching rate of the first sacrificial layer 4a with respect to the dissolving liquid for dissolving the first sacrificial layer 4a can be made greater than the etching rate of the first organic compound layer 3 with respect to the dissolving liquid for dissolving the first sacrificial layer 4a.

An intermediate layer 5 is formed on the first sacrificial layer 4a as shown in FIG. 1D. For the intermediate layer 5, the following material is selected: a material which has high solubility in a solvent having a low ability to dissolve the first sacrificial layer 4a and which does not damage the first sacrificial layer 4a or the first organic compound layer 3. That is, the following relation is satisfied: the relation that the etching rate of the intermediate layer 5 with respect to a dissolving liquid dissolving the intermediate layer 5 is greater than that of the first sacrificial layer 4a.

When the first sacrificial layer 4a is made of a material with low solubility in water, water can be used to dissolve the intermediate layer 5. In this case, the intermediate layer 5 may be made of a water-soluble inorganic material such as LiF or NaCl or a water-soluble polymer such as polyvinyl alcohol (PVA) or polyvinylpyrrolidone (PVP).

After a photoresist layer 6 is formed on the intermediate layer 5, the photoresist layer 6 is patterned by photolithography, whereby a masking layer is formed on a predetermined region as shown in FIG. 1E. With reference to FIG. 1E, the photoresist layer 6 (the masking layer) is selectively patterned so as to remain on the first electrodes 2a. The following material is selected for the photoresist layer 6: a photoresist material of which the etching rate with respect to a developer for developing the photoresist layer 6 is greater than that of the intermediate layer 5. If the developer for developing the photoresist layer 6 can dissolve the first organic compound layer 3 or can cause the dissolution or degradation of the intermediate layer 5, a protective layer may be provided between the intermediate layer 5 and the photoresist layer 6. The protective layer is may be made of an inorganic material such as silicon nitride or silicon oxide. The use of the protective layer allows the possible dissolution or degradation of the intermediate layer 5 or the first organic compound layer 3 due to the formation of the photoresist layer 6 to be suppressed and also allows alternatives to a material that can be used to form the photoresist layer 6 to be increased. The protective layer applies to a second embodiment below.

Photolithography is used to form the masking layer on the predetermined region of the intermediate layer 5 as described above. An inkjet process or a printing process may be used to form the predetermined region instead of photolithography.

The intermediate layer 5, the first sacrificial layer 4a, and the first organic compound layer 3 are removed from a region not covered by the masking layer by a dry or wet etching process, whereby the intermediate layer 5, the first sacrificial layer 4a, and the first organic compound layer 3 are patterned as shown in FIG. 1F.

In this step, each first electrode 2b is exposed. When the intermediate layer 5, the first sacrificial layer 4a, and the first organic compound layer 3 are etched off from the region not covered by the masking layer, the masking layer may be partly or entirely removed. FIG. 1F shows such a state that the masking layer is removed by etching during the etching of the intermediate layer 5, the first sacrificial layer 4a, and the first organic compound layer 3. After the intermediate layer 5, the first sacrificial layer 4a, and the first organic compound layer 3 are removed from the region no covered by the masking layer, the masking layer may remain on the intermediate layer 5.

The second organic compound layer 7, which emits light different in color from light emitted from the first organic compound layer 3, and a second sacrificial layer 4b are formed on the element substrate 1 provided with the patterned first organic compound layer 3, first sacrificial layer 4a, and intermediate layer 5 as shown in FIG. 1G. A material used to form the second sacrificial layer 4b may be selected in accordance with substantially the same standards as those used for the first sacrificial layer 4a. That is, this material is selected such that the etching rate of the second sacrificial layer 4b with respect to a dissolving liquid for dissolving the second sacrificial layer 4b is greater than the etching rate of the first and second organic compound layers 3 and 7 with respect to the dissolving liquid for dissolving the second sacrificial layer 4b. The first sacrificial layer 4a and the second organic compound layer 7 need to meet substantially the same condition as above.

The second sacrificial layer 4b, as well as the first sacrificial layer 4a, and the intermediate layer 5 need to meet such a condition that the solubility of the intermediate layer 5 in a solvent having a low ability to dissolve the second sacrificial layer 4b is high. In other words, the second sacrificial layer 4b and the intermediate layer 5 need to meet such a condition that the etching rate of the intermediate layer 5 with respect to a dissolving liquid for dissolving the intermediate layer 5 is greater than the etching rate of the first and second sacrificial layers 4a and 4b with respect to the dissolving liquid for dissolving the intermediate layer 5. The etching rate of the intermediate layer 5 with respect to the dissolving liquid for dissolving the intermediate layer 5 may be ten times or more the etching rate of the first and second sacrificial layers 4a and 4b with respect to the dissolving liquid for dissolving the intermediate layer 5 and even 100 times or more. When the etching rate of the intermediate layer 5 with respect to the dissolving liquid for dissolving the intermediate layer 5 is less than ten times the etching rate of the first and second sacrificial layers 4a and 4b with respect to the dissolving liquid for dissolving the intermediate layer 5, it is difficult to quickly remove the intermediate layer 5 and the layers formed thereon such that the first or second sacrificial layer 4a or 4b remains on the first or second organic compound layer 3 or 7.

Portions of the second organic compound layer 7 and second sacrificial layer 4b that overlie the first sacrificial layer 4a are lifted off (removed) in such a manner that the intermediate layer 5 is contacted with the dissolving liquid for dissolving the intermediate layer 5 and is dissolved therein as shown in FIG. 1H. The solubility of the second sacrificial layer 4b in the dissolving liquid for dissolving the intermediate layer 5 is low and therefore the second sacrificial layer 4b removed from the first sacrificial layer 4a is hardly dissolved therein. When the dissolving liquid for dissolving the intermediate layer 5 is water, the second organic compound layer 7 is not dissolved therein. The lifted-off portions are not dissolved and are suspended in the dissolving liquid for dissolving the intermediate layer 5. In aspects of the present invention, the first sacrificial layer 4a and the second sacrificial layer 4b are placed on the first organic compound layer 3 and the second organic compound layer 7, respectively. Therefore, surfaces of the first and second organic compound layers 3 and 7 are not damaged by the lifted-off portions or element properties are not impaired.

The first sacrificial layer 4a and the second sacrificial layer 4b are removed from the first organic compound layer 3 and the second organic compound layer 7, respectively, in such a manner that the first and second sacrificial layers 4a and 4b are selectively dissolved as shown in FIG. 1I. Investigations made by the inventors have shown that even though there is a large difference between the etching rate of an intermediate layer with respect to a dissolving liquid for dissolving this intermediate layer and the etching rate of an organic compound layer placed under this intermediate layer with respect to the dissolving liquid for dissolving this intermediate layer as described in Japanese Patent No. 4507759, it is difficult to remove this intermediate layer without leaving residue. A water-soluble inorganic material or water-soluble polymer usually used in this intermediate layer is insulating; hence, when the residue of this intermediate layer remains on a surface of this organic compound layer, element properties are impaired in some cases. In particular, when an intermediate layer is made is made of a polymer material such as polyvinyl alcohol, polyvinylpyrrolidone, or alcohol-soluble nylon, such a problem is likely to arise. Furthermore, the investigations have shown that a similar problem may possibly arise between the first and second sacrificial layers 4a and 4b and the first and second organic compound layers 3 and 7.

Therefore, the etching rate of the first and second sacrificial layers 4a and 4b with respect to a dissolving liquid for dissolving the first and second sacrificial layers 4a and 4b may be greater than the etching rate of the first and second organic compound layers 3 and 7 with respect to the dissolving liquid for dissolving the first and second sacrificial layers 4a and 4b and the first and second sacrificial layers 4a and 4b may be made of a material that does not impair element properties even if the residue thereof remains on the first and second organic compound layers 3 and 7. In particular, the first and second sacrificial layers 4a and 4b may be made of a carrier-transporting material because even if the carrier-transporting material remains on the first and second organic compound layers 3 and 7, the carrier-transporting material does not interrupt the migration of carriers and therefore element properties are not impaired. Examples of the carrier-transporting material include heterocyclic compounds and organic compounds containing an electron-donating or electron-withdrawing group.

Finally, a second electrode 9 is formed over the first and second organic compound layers 3 and 7, whereby the basic configuration of the organic electroluminescent device is completed as shown in FIG. 1J. A common organic compound layer may be formed over the first and second organic compound layers 3 and 7 prior to the formation of the second electrode 9. The common organic compound layer is not particularly limited and may be formed subsequently to the formation of a light-emitting layer that needs to be patterned for each pixel. When the first electrodes 2a and 2b are anodes, the common organic compound layer may be, for example, a charge transport layer, a charge injection layer, or the like.

The second electrode 9 may be made of a transparent electrode material such as indium tin oxide (ITO) or indium zinc oxide or a known electrode material or may be made from a multilayer film containing the transparent electrode material. In order to send light emitted from the first and second organic compound layers 3 and 7 outside, at least one of the first electrodes 2a and 2b and the second electrode 9 is made of a transparent or translucent material. The term "transparent material" as used herein refers to a material with a transmittance of 80% or more for visible light. The term "translucent material" as used herein refers to a material with a transmittance of 20% to less than 80% for visible light. After the second electrode 9 is formed, a known sealing member (not shown) may be provided thereon for the purpose of preventing moisture from entering the first and second organic electroluminescent elements from outside.

According to aspects of the present invention, when the intermediate layer 5 is removed and the layers formed thereon are lifted off, portions of the second organic compound layer 7 that are removed from the element substrate 1 can be prevented from coming into contact with the first and second organic compound layers 3 and 7 remaining on the element substrate 1 because the first organic compound layer 3 and the second organic compound layer 7 are covered with the first sacrificial layer 4a and the second sacrificial layer 4b, respectively, as described above. As a result, the removed portions of the second organic compound layer 7 do not physically damage the first and second organic compound layers 3 and 7 remaining on the element substrate 1 and the deterioration of properties of the first and second organic electroluminescent elements can be suppressed.

Since surfaces of the first and second organic compound layers 3 and 7 are exposed only during the period between the removal of the first and second sacrificial layers 4a and 4b and the formation of the second electrode 9, impurities in a process atmosphere hardly adhere to surfaces of the first and second organic compound layers 3 and 7 and therefore the deterioration of properties of the first and second organic electroluminescent elements can be suppressed. This action is particularly effective in the case of adding a step such as a step of forming a third organic compound layer as described in a second embodiment below.

Furthermore, according to aspects of the present invention, a multicolor organic electroluminescent device having high definition and excellent properties can be manufactured because an insulating material contained in an intermediate layer or the like does not remain on each organic compound layer.

FIGS. 3A to 3M show steps of a method of manufacturing an organic electroluminescent device according to a second embodiment of the present invention. The organic electroluminescent device is a multicolor display and includes an element substrate 1, first organic electroluminescent elements, second organic electroluminescent elements, and third organic electroluminescent elements, the first to third organic electroluminescent elements being arranged on the element substrate 1. The first, second, and third organic electroluminescent elements include different light-emitting layers and emit light of different colors. One pixel including one of the first organic electroluminescent elements, one of the second organic electroluminescent elements, and one of the third organic electroluminescent elements is shown in FIG. 3M for simple illustration. However, in actual, a plurality of pixels are two-dimensionally arranged on the element substrate 1 as shown in FIG. 2.

Figure 3A:
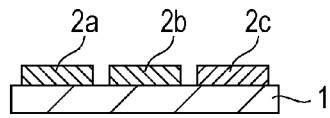
FIGS. 3A to 3M are schematic sectional views illustrating steps of a method of manufacturing an organic electroluminescent device according to a second embodiment of the present invention.
Figure 3B:
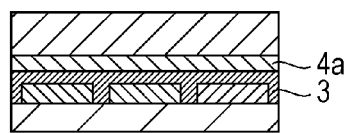
Figure 3C:
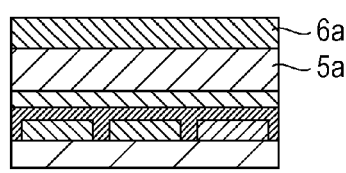
Figure 3D:
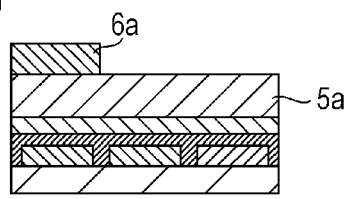
Figure 3E:
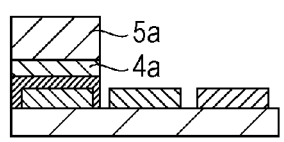

First electrodes 2a, 2b, and 2c for the corresponding first, second, and third organic electroluminescent elements are formed in the same manner as that described in the first embodiment as shown in FIG. 3A. A first organic compound layer 3, a first sacrificial layer 4a, and a first intermediate layer 5a are formed over the first electrodes 2a, 2b, and 2c in that order as shown in FIG. 3B. A photoresist layer (masking layer) 6a is selectively formed above each first electrode 2a by photolithography as shown in FIGS. 3C and 3D. Portions of the first organic compound layer 3, first sacrificial layer 4a, and first intermediate layer 5a that are located in a region other than a region on the first electrode 2a are removed using the photoresist layer 6a as a mask as shown in FIG. 3E. With reference to FIG. 3E, the photoresist layer 6a is removed in a step of partly removing the first organic compound layer 3, the first sacrificial layer 4a, and the first intermediate layer 5a. However, the photoresist layer 6a may remain in this step.

Figure 3F:
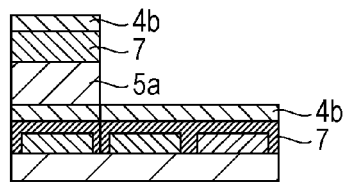
Figure 3G:
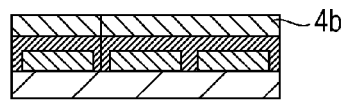
Figure 3H:
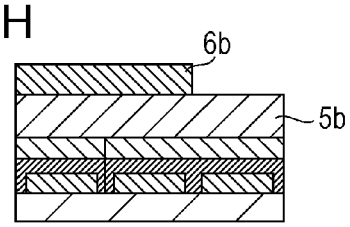
Figure 3I:
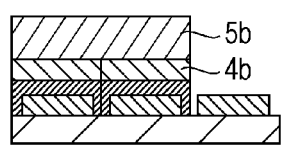

A second organic compound layer 7 and a second sacrificial layer 4b are formed over the first intermediate layer 5a and first electrodes 2b and 2c remaining on the element substrate 1 in that order as shown in FIG. 3F. Portions of the second organic compound layer 7 and second sacrificial layer 4b that overlie the first intermediate layer 5a are lifted off (removed) in such a manner that the first intermediate layer 5a is contacted with a first dissolving liquid and is selectively dissolved therein as shown in FIG. 3G. A second intermediate layer 5b and a photoresist layer 6b are formed on the element substrate 1 provided with the first and second sacrificial layers 4a and 4b in that order. Portions of the photoresist layer 6b that overlie the first electrodes 2c are removed by photolithography such that the photoresist layer 6b remains above the first electrodes 2a and 2b as shown in FIG. 3H. The first electrodes 2c are exposed in such a manner that portions of the second intermediate layer 5b, second sacrificial layer 4b, and second organic compound layer 7 that overlie the first electrodes 2c are removed by etching using the photoresist layer (masking layer) 6b as a mask as shown in FIG. 3I. With reference to FIG. 3I, the photoresist layer 6a is removed by etching while the portions of the second intermediate layer 5b, second sacrificial layer 4b, and second organic compound layer 7 that overlie the first electrodes 2c are removed. However, the photoresist layer 6a may remain in this step.

Figure 3J:
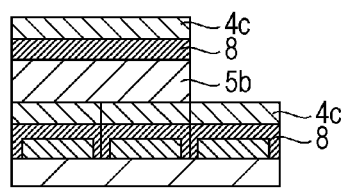
Figure 3K:
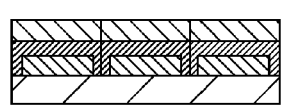
Figure 3L:
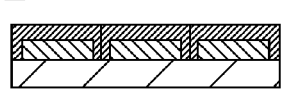
Figure 3M:
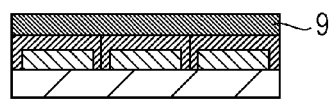

A third organic compound layer 8 and a third sacrificial layer 4c are formed above the element substrate 1 as shown in FIG. 3J. Thereafter, portions of the third organic compound layer 8 and third sacrificial layer 4c that overlie the second intermediate layer 5b are lifted off in such a manner that the second intermediate layer 5b is contacted with a second dissolving liquid and is selectively dissolved therein as shown in FIG. 3K. A material used to form each sacrificial layer may be selected on the basis of substantially the same concept as that used to select the first and second sacrificial layers 4a and 4b described in the first embodiment. In particular, a material meeting three conditions below is selected. A first condition is to satisfy the relation that the etching rate of the first intermediate layer 5a with respect to the first dissolving liquid is greater than the etching rate of the first and second sacrificial layers 4a and 4b with respect to the first dissolving liquid in a step of removing the first intermediate layer 5a and the layers formed thereon. A second condition is to satisfy the relation that the etching rate of the second intermediate layer 5b with respect to the second dissolving liquid is greater than the etching rate of the first to third sacrificial layers 4a to 4c with respect to the second dissolving liquid in a step of removing the second intermediate layer 5b and the layers formed thereon. A third condition is to satisfy the relation that the etching rate of the first to third sacrificial layers 4a to 4c with respect to a solvent is greater than the etching rate of surfaces of the first, second, and third organic compound layers 3, 7, and 8 with respect to the solvent in a step of removing the first to third sacrificial layers 4a to 4c. The appropriate selection of the material satisfying the three conditions allows the first, second, and third organic compound layers 3, 7, and 8 to be protected from being physically or chemically damaged by processing the first to third sacrificial layers 4a to 4c until the patterning of the first, second, and third organic compound layers 3, 7, and 8 is completed. Furthermore, the first to third sacrificial layers 4a to 4c can be removed from the first, second, and third organic compound layers 3, 7, and 8 without dissolving surface portions of the first, second, and third organic compound layers 3, 7, and 8.

The first to third sacrificial layers 4a to 4c may be made of a carrier-transporting material because even if the carrier-transporting material remains on the first, second, and third organic compound layers 3, 7, and 8, the carrier-transporting material does not interrupt the migration of carriers and therefore element properties are not impaired. Examples of the carrier-transporting material include heterocyclic compounds and organic compounds containing an electron-donating or electron-withdrawing group.

The first to third sacrificial layers 4a to 4c are removed by wet etching in such a manner that the first to third sacrificial layers 4a to 4c are contacted with solvents dissolving a corresponding one of the first to third sacrificial layers 4a to 4c, whereby the patterning of the first, second, and third organic compound layers 3, 7, and 8 is completed. A material common to the first to third sacrificial layers 4a to 4c may be used because the first to third sacrificial layers 4a to 4c can be removed in one step using one type of solvent. Finally, a second electrode 9 is formed over the first, second, and third organic compound layers 3, 7 and 8, whereby the basic configuration of the organic electroluminescent device is completed as shown in FIG. 3M. A common organic compound layer may be formed over the first, second, and third organic compound layers 3, 7 and 8 prior to the formation of the second electrode 9 as described in the first embodiment.

According to aspects of the present invention, portions of the first, second, and third organic compound layers 3, 7 and 8 that are removed from the element substrate 1 can be prevented from coming into contact with the first, second, and third organic compound layers 3, 7 and 8 remaining on the element substrate 1 because each of the first, second, and third organic compound layers 3, 7 and 8 are covered with a corresponding one of the first, second, and third sacrificial layers 4a, 4b, and 4c in the step of removing the first intermediate layer 5a or the second intermediate layer 5b. As a result, the removed portions of the first, second, and third organic compound layers 3, 7 and 8 do not physically damage the first, second, and third organic compound layers 3, 7, and 8 remaining on the element substrate 1 and the deterioration of properties of the first to third organic electroluminescent elements can be suppressed.

Since surfaces of the first, second, and third organic compound layers 3, 7, and 8 are exposed only during the period between the removal of the first to third sacrificial layers 4a to 4c and the formation of the second electrode 9, impurities in air hardly adhere to surfaces of the first, second, and third organic compound layers 3, 7, and 8 and therefore the deterioration of properties of the first to third organic electroluminescent elements can be suppressed. In this embodiment, portions of the first and second organic compound layers 3 and 7 are removed in two steps. If the first sacrificial layer 4a is not formed, then the first organic compound layer 3 is exposed to a second removing step. In this embodiment, the first, second, and third organic compound layers 3, 7, and 8, which are included in the first, second, and third organic electroluminescent elements, are covered with the first, second, and third sacrificial layers 4a, 4b, and 4c. Since surfaces of the first, second, and third organic compound layers 3, 7, and 8 are not exposed until the first, second, and third sacrificial layers 4a, 4b, and 4c are removed for the purpose of forming the second electrode 9, the deterioration of properties due to the adhesion of impurities in a process atmosphere can be prevented.

EXAMPLES

An example of the present invention is described below in detail.

An organic electroluminescent device was manufactured in accordance with the steps shown in FIG. 3A to 3M. After an AlNd film (reflective electrode) was formed over an element substrate 1 by a sputtering process, an ITO film was formed thereon by a sputtering process. The AlNd film had a thickness of 100 nm. The ITO film had a thickness of 10 nm. A laminate consisting of the AlNd film and the ITO film functioned as a first electrode. The laminate consisting of the AlNd film and the ITO film was patterned by known photolithography, whereby first electrodes 2a, 2b, and 2c included in first organic electroluminescent elements, second organic electroluminescent elements, and third organic electroluminescent elements, respectively, were formed as shown in FIG. 3A. The element substrate 1 used was a glass substrate having circuits (not shown), arranged thereon, for driving the first to third organic electroluminescent elements, the circuits being covered with an insulating layer. The first electrodes 2a, 2b, and 2c were electrically connected to the circuits through contact holes, which are not shown in FIG. 3A, provided in the insulating layer.

A first organic compound layer 3 including a light-emitting sub-layer emitting blue light and other sub-layers was formed on the element substrate 1, provided with the first electrodes 2a, 2b, and 2c formed by patterning, by a vacuum vapor deposition process. In particular, after a hole transport sub-layer was formed over a surface of the element substrate 1 that had the first electrodes 2a, 2b, and 2c so as to have a thickness of 120 nm, the light-emitting sub-layer was formed thereon using a blue light-emitting material so as to have a thickness of 30 nm. A condensed polycyclic hydrocarbon (Compound 1) below was deposited on the light-emitting sub-layer, whereby a hole-blocking sub-layer was formed. The hole-blocking sub-layer had a thickness of 10 nm. The first organic compound layer 3 was formed as described above.

Compound 1

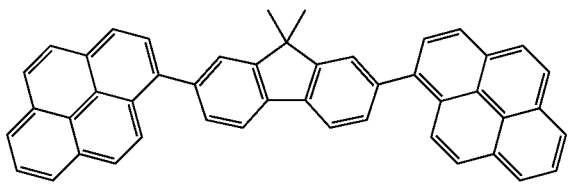

A phenanthroline derivative (Compound 2) below was deposited on the first organic compound layer 3 by a vacuum vapor deposition process, whereby a first sacrificial layer 4a was formed. The first sacrificial layer 4a had a thickness of 40 nm.

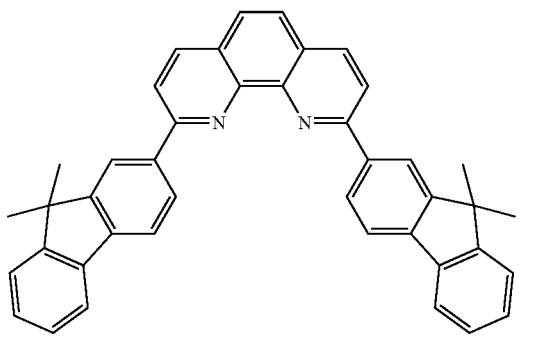

Compound 2

A water-soluble polymer, that is, polyvinylpyrrolidone (PVP) was mixed with water, whereby an aqueous PVP solution was prepared. The aqueous PVP solution was applied to the first sacrificial layer 4a by a spin coating process and was then dried, whereby a first intermediate layer 5a with a thickness of 500 nm was formed as shown in FIG. 3B. A photoresist material, AZ1500™, commercially available from AZ Electronic Materials was deposited on the first intermediate layer 5a by a spin coating process and a solvent contained in the deposited photoresist material was evaporated, whereby a photoresist layer 6a was formed as shown in FIG. 3C. The photoresist layer 6a had a thickness of 1,000 nm.

The element substrate 1 provided with the photoresist layer 6a was set in an exposure system. The photoresist layer 6a was exposed to light for 40 seconds through a photomask such that portions of the photoresist layer 6a were selectively arranged above the first electrodes 2a. The exposed photoresist layer 6a was developed for one minute using a developer (a 50% solution of 312 MIF™, available from AZ Electronic Materials, diluted with water) for photoresist layers. This removed portions of the photoresist layer 6a that were located above the first electrodes 2b and 2c as shown in FIG. 3D.

Portions of the first intermediate layer 5a that were not covered by the photoresist layer 6a were removed in such a manner that the portions thereof were dry-etched for five minutes using the photoresist layer 6a remaining above the element substrate 1 as a mask under the following conditions while a reactive gas, that is, oxygen was being supplied at a flow rate of 20 sccm: a pressure of 8 Pa and a power of 150 W. The first sacrificial layer 4a and the first organic compound layer 3 were partly removed by dry etching under the same conditions as above as shown in FIG. 3E. Portions of the first organic compound layer 3 were selectively arranged on the first electrodes 2a as described above. Since dry etching was performed as described above, the photoresist layer 6a lying on the first intermediate layer 5a was etched off at the point of time when the etching of the first organic compound layer 3 was completed.

A second organic compound layer 7 including a light-emitting sub-layer emitting red light was formed in substantially the same manner as that used to form the first organic compound layer 3. In particular, after a hole transport sub-layer was formed so as to have a thickness of 200 nm, this light-emitting sub-layer was formed thereon using a red light-emitting material so as to have a thickness of 30 nm. The condensed polycyclic hydrocarbon, that is, Compound 1 was deposited on this light-emitting sub-layer, whereby a hole-blocking sub-layer was formed. This hole-blocking sub-layer had a thickness of 10 nm. Subsequently, the phenanthroline derivative, that is, Compound 2 was deposited on the second organic compound layer 7, whereby a second sacrificial layer 4b was formed so as to have a thickness of 40 nm as shown in FIG. 3F.

The element substrate 1 provided with the second sacrificial layer 4b and the like was immersed in a dissolving liquid for dissolving the first intermediate layer 5a, that is, in water (running water). The first intermediate layer 5a was capable of being selectively dissolved because the etching rate of the first intermediate layer 5a, which was made of water-soluble polyvinylpyrrolidone, with respect to water was 100 times or more the etching rate of the first and second sacrificial layers 4a and 4b, which were made of the phenanthroline derivative, that is, Compound 2, with respect to water. Since the first intermediate layer 5a was dissolved, layers formed on the first intermediate layer 5a were lifted off. Portions of the first organic compound layer 3 and first sacrificial layer 4a were stacked on the first electrodes 2a and portions of the second organic compound layer 7 and second sacrificial layer 4b were stacked on the first electrodes 2b and 2c as shown in FIG. 3G.

A second intermediate layer 5b, as well as the first intermediate layer 5a, was formed by applying polyvinylpyrrolidone by a spin coating process and portions of a photoresist layer 6b were selectively formed on the first electrodes 2a and 2b as shown in FIG. 3H. Portions of the second intermediate layer 5b, second sacrificial layer 4b, and second organic compound layer 7 stacked on the first electrodes 2c were selectively removed using the portions of the photoresist layer 6b formed on the first electrodes 2a and 2b as a mask as shown in FIG. 3I. Dry etching conditions were the same as those used to remove the photoresist layer 6a.

A third organic compound layer 8 including a light-emitting sub-layer emitting green light was formed in substantially the same manner as that used to form the first organic compound layer 3. In particular, after a hole transport sub-layer was formed so as to have a thickness of 160 nm, this light-emitting sub-layer was formed thereon using a known green light-emitting material so as to have a thickness of 30 nm and a hole-blocking sub-layer was formed on this light-emitting sub-layer using Compound 1 so as to have a thickness of 10 nm. A third sacrificial layer 4c was formed on the third organic compound layer 8 in substantially the same manner as that used to form the second sacrificial layer 4b using Compound 2 so as to have a thickness of 40 nm as shown in FIG. 3J.

The element substrate 1 provided with the third sacrificial layer 4c and the like was immersed in a dissolving liquid for dissolving the second intermediate layer 5b, that is, in water (running water). The second intermediate layer 5b was dissolved because the etching rate of the second intermediate layer 5b, which was made of water-soluble polyvinylpyrrolidone, with respect to water was 100 times or more the etching rate of the first to third sacrificial layers 4a to 4c, which were made of the phenanthroline derivative, with respect to water. This resulted in that layers formed on the second intermediate layer 5b were lifted off and the first, second, and third sacrificial layers 4a, 4b, and 4c were placed on the first, second, and third organic compound layers 3, 7, and 8, respectively, as shown in FIG. 3K.

The element substrate 1 provided with the first, second, and third sacrificial layers 4a, 4b, and 4c placed on the first, second, and third organic compound layers 3, 7, and 8, respectively, was immersed in a solvent mixture (a mixture containing a polar solvent) of isopropyl alcohol (IPA) and water, whereby the first, second, and third sacrificial layers 4a, 4b, and 4c were removed from the first, second, and third organic compound layers 3, 7, and 8, respectively. The solvent mixture used was one that was prepared by mixing IPA and water so as to contain 60% by weight of IPA. The immersion time of the element substrate 1 in the solvent mixture was 200 seconds. The etching rate of the first to third sacrificial layers 4a to 4c, which were made of the phenanthroline derivative, that is, Compound 2, with respect to the solvent mixture was about 160 times that of the hole-blocking sublayers, which were made of the condensed polycyclic hydrocarbon, that is, Compound 1. Therefore, as shown in FIG. 3I, the first to third sacrificial layers 4a to 4c were capable of being selectively removed such that the hole-blocking sublayers, which were placed on outer surfaces (surfaces located opposite the element substrate 1) of the first, second, and third organic compound layers 3, 7, and 8, were hardly dissolved.

A charge transport layer (not shown) and an electron injection layer (not shown) were formed over the first, second, and third organic compound layers 3, 7, and 8 in that order. In particular, after the charge transport layer was formed using Compound 2 so as to have a thickness of 20 nm, the electron injection layer was formed by the co-deposition of Compound 2 and cesium carbonate ($Cs_2CO_3$) so as to have a thickness of 20 nm. Thereafter, silver (Ag) was deposited on the electron injection layer by a sputtering process, whereby a translucent second electrode 9 was formed so as to have a thickness of 16 nm as shown in FIG. 3M.

Finally, sealing glass (not shown) was bonded to the element substrate 1 with an adhesive made of a UV-curable resin in a nitrogen atmosphere, whereby the organic electroluminescent device was completed. Ten organic electroluminescent devices were manufactured by the above method. In a comparative example, in order to confirm advantages of aspects of the present invention, ten organic electroluminescent devices were manufactured by substantially the same method as that used in the example except that none of first to third sacrificial layers 4a to 4c was formed.

The organic electroluminescent devices manufactured in the example and the organic electroluminescent devices manufactured in the comparative example were observed with a microscope. Some of the organic electroluminescent devices manufactured in the comparative example had surface defects. The organic electroluminescent devices manufactured in the example and the organic electroluminescent devices manufactured in the comparative example were turned on to display white. In the organic electroluminescent devices manufactured in the example, the average number of pixels emitting no light was 0.4. In the organic electroluminescent devices manufactured in the comparative example, the average number of pixels emitting no light was seven. In the organic electroluminescent devices manufactured in the comparative example, about 80% of the pixels emitting no light corresponded to the surface defects.

The organic electroluminescent devices manufactured in the example and the organic electroluminescent devices manufactured in the comparative example were compared in such a manner that each organic electroluminescent element emitting light of a specific color such as red, green, or blue was turned on and was measured for current-luminance characteristic (current efficiency) and voltage-current characteristic (driving voltage). There was no difference in current-luminance characteristic between the organic electroluminescent devices manufactured in the example and the organic electroluminescent devices manufactured in the comparative example. The current-luminance characteristic was evaluated using the average driving voltage of the ten organic electroluminescent devices manufactured in the example as a standard characteristic. The current-luminance characteristic of the ten organic electroluminescent devices manufactured in the example was within ±5% of the standard characteristic. Three of the ten organic electroluminescent devices manufactured in the comparative example had a driving voltage that was about 10% to 20% greater than the standard characteristic.

As is clear from the above results, the method used to manufacture the organic electroluminescent devices in the example is more useful in manufacturing an organic electroluminescent device having stable properties in good yield as compared with the method used to manufacture the organic electroluminescent devices in the comparative example. That is, the use of a sacrificial layer enables the reduction of physical damage during processing and the use of a material with charge injection ability to form the sacrificial layer suppresses the influence of the residue of the sacrificial layer to enable the stable manufacture of an organic electroluminescent device having high properties.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2011-257781 filed Nov. 25, 2011, which is hereby incorporated by reference herein in its entirety.

What is claimed is:

1. A method of manufacturing an organic electroluminescent device including a substrate and organic electroluminescent elements which are placed on the substrate and which each include a first electrode, a second electrode, and an organic compound layer placed between the first electrode and the second electrode, the method comprising:
   a step of forming a first organic compound layer, a first sacrificial layer, and an intermediate layer on the substrate provided with the first electrodes in that order;
   a step of selectively forming a masking layer on a predetermined region of the intermediate layer;
   a step of partly removing the intermediate layer, the first sacrificial layer, and the first organic compound layer from a region not covered by the masking layer;
   a step of forming a second organic compound layer and a second sacrificial layer over the remaining intermediate layer and the region from which the first organic compound layer is removed in that order;
   a step of removing the intermediate layer and the layers formed thereon in such a manner that the intermediate layer is contacted with a dissolving liquid and is dissolved therein;
   a step of removing the first and second sacrificial layers in such a manner that the first and second sacrificial layers are contacted with a dissolving liquid and are dissolved therein; and
   a step of forming the second electrode over the first and second organic compound layers remaining on the first electrodes.

2. The method according to claim 1, wherein the etching rate of the intermediate layer with respect to the dissolving liquid for dissolving the intermediate layer is greater than the etching rate of the first and second sacrificial layers with respect to the dissolving liquid for dissolving the intermediate layer and the etching rate of the first and second sacrificial layers with respect to the dissolving liquid for dissolving the first and second sacrificial layers is greater than the etching rate of the first and second organic compound layers with respect to the dissolving liquid for dissolving the first and second sacrificial layers.

3. The method according to claim 2, wherein the etching rate of the intermediate layer with respect to the dissolving liquid for dissolving the intermediate layer is ten times or more the etching rate of the first and second sacrificial layers with respect to the dissolving liquid for dissolving the intermediate layer and the etching rate of the first and second sacrificial layers with respect to the dissolving liquid for dissolving the first and second sacrificial layers is ten times or more the etching rate of the first and second organic compound layers with respect to the dissolving liquid for dissolving the first and second sacrificial layers.

4. The method according to claim 1, wherein the first and second sacrificial layers are made of a carrier-transporting material.

5. The method according to claim 4, wherein the carrier-transporting material is a heterocyclic compound or an organic compound containing an electron-donating or electron-withdrawing group and the dissolving liquid for dissolving the first and second sacrificial layers is water or a polar solvent containing an organic compound containing a heteroatom.

6. The method according to claim 5, wherein the outermost sub-layer of each of the first and second organic compound layers is made of an organic compound obtained by singly bonding condensed polycyclic hydrocarbons.

7. The method according to claim 1, wherein the dissolving liquid for dissolving the intermediate layer contains water and the intermediate layer is made of a water-soluble inorganic material or a water-soluble polymer.

8. The method according to claim 7, wherein the water-soluble polymer is polyvinyl alcohol or polyvinylpyrrolidone.

9. The method according to claim 1, wherein the step of selectively forming the masking layer on the predetermined region of the intermediate layer is performed by photolithography.

10. The method according to claim 1, wherein the step of partly removing the intermediate layer, the first sacrificial layer, and the first organic compound layer from the region not covered by the masking layer is performed by dry etching using an $O_2$ gas.

11. The method according to claim 10, wherein the masking layer is removed in the step of partly removing the intermediate layer, the first sacrificial layer, and the first organic compound layer from the region not covered by the masking layer.

12. The method according to claim 1, further comprising:
a step of forming a protective layer on the intermediate layer between the step of forming the first organic compound layer, the first sacrificial layer, and the intermediate layer in that order and the step of forming the masking layer; and
a step of partly removing the protective layer from a region not covered by the masking layer between the step of forming the masking layer and the step of partly removing the intermediate layer, the first sacrificial layer, and the first organic compound layer from the region not covered by the masking layer.

13. The method according to claim 12, wherein the protective layer is made of silicon nitride or silicon oxide.

14. The method according to claim 13, wherein the step of partly removing the protective layer from the region not covered by the masking layer is performed by dry etching using a $CF_4$ gas.

15. The method according to claim 1, wherein the second electrode has a transmittance of 20% or more for visible light and the organic electroluminescent elements emit light through the second electrode.

16. A method of manufacturing an organic electroluminescent device including a substrate and organic electroluminescent elements which are placed on the substrate and which each include a first electrode, a second electrode, and an organic compound layer placed between the first electrode and the second electrode, the method comprising, in this order:
a step of forming a first organic compound layer, a first sacrificial layer, and a first intermediate layer on the substrate provided with the first electrodes in that order;
a step of selectively forming a masking layer on a predetermined region of the first intermediate layer;
a step of partly removing the first intermediate layer, the first sacrificial layer, and the first organic compound layer from a region not covered by the masking layer;
a step of forming a second organic compound layer and a second sacrificial layer over the remaining first intermediate layer and the region from which the first organic compound layer is removed in that order;
a step of removing the first intermediate layer and the layers formed thereon in such a manner that the first intermediate layer is contacted with a first dissolving liquid and is dissolved therein;
a step of forming a second intermediate layer over the first sacrificial layer and the second sacrificial layer;
a step of selectively forming another masking layer on a portion of the second intermediate layer that is located on one of a region having the first sacrificial layer and a region having the second sacrificial layer;
a step of partly removing the second intermediate layer, the second sacrificial layer, and the second organic compound layer from a region not covered by this masking layer;
a step of forming a third organic compound layer and a third sacrificial layer over the remaining second intermediate layer and the region from which the second organic compound layer is removed in that order;
a step of removing the second intermediate layer and the layers formed thereon in such a manner that the second intermediate layer is contacted with a second dissolving liquid and is dissolved therein;
a step of removing the first to third sacrificial layers in such a manner that the first to third sacrificial layers are contacted with a dissolving liquid and are dissolved therein; and
a step of forming the second electrode over the first to third organic compound layers.

17. The method according to claim 16, wherein the etching rate of the first intermediate layer with respect to the first dissolving liquid is greater than the etching rate of the first and second sacrificial layers with respect to the first dissolving liquid in the step of removing the first intermediate layer and the layers formed thereon, the etching rate of the second intermediate layer with respect to the second dissolving liquid is greater than the etching rate of the first to third sacrificial layers with respect to the second dissolving liquid in the step of removing the second intermediate layer and the layers formed thereon, and the etching rate of the first to third sacrificial layers with respect to the dissolving liquid for dissolving the first to third sacrificial layers is greater than the etching rate of the first to third organic compound layers with respect to the dissolving liquid for dissolving the first to third sacrificial layers in the step of removing the first to third sacrificial layers.

* * * * *